(12) United States Patent
Chitnis

(10) Patent No.: US 8,617,997 B2
(45) Date of Patent: Dec. 31, 2013

(54) SELECTIVE WET ETCHING OF GOLD-TIN BASED SOLDER

(75) Inventor: Ashay Chitnis, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/894,917

(22) Filed: Aug. 21, 2007

(65) Prior Publication Data
US 2009/0050903 A1   Feb. 26, 2009

(51) Int. Cl.
*H01L 21/302* (2006.01)
*H01L 21/461* (2006.01)

(52) U.S. Cl.
USPC ........... 438/714; 438/614; 438/689; 438/694; 257/E21.17; 257/E21.508

(58) Field of Classification Search
USPC ............ 438/689, 614, 694, 714; 257/E21.17, 257/E21.508
See application file for complete search history.

(56) References Cited

U.S. PATENT DOCUMENTS

| | | | |
|---|---|---|---|
| 4,865,685 A | 9/1989 | Palmour | 156/643 |
| 4,902,356 A | 2/1990 | Noguchi et al. | 148/33.4 |
| 4,912,532 A | 3/1990 | Cook et al. | 357/16 |
| 5,103,271 A | 4/1992 | Izumiya et al. | 357/17 |
| 5,376,580 A | 12/1994 | Kish et al. | 437/127 |
| 5,502,316 A | 3/1996 | Kish et al. | 257/94 |
| 5,534,442 A * | 7/1996 | Parker et al. | 438/25 |
| 5,679,152 A | 10/1997 | Tischler et al. | 117/97 |
| 5,741,432 A * | 4/1998 | Wong | 216/108 |
| 5,958,687 A | 9/1999 | Dehoux et al. | 438/46 |
| 6,071,795 A | 6/2000 | Cheung et al. | 438/458 |
| 6,210,479 B1 | 4/2001 | Bojarczuk et al. | 117/84 |
| 6,258,699 B1 | 7/2001 | Chang et al. | 438/458 |
| 6,303,405 B1 | 10/2001 | Yoshida et al. | 438/46 |
| 6,320,206 B1 | 11/2001 | Coman et al. | 257/94 |
| 6,365,429 B1 | 4/2002 | Kneissl et al. | 438/46 |
| 6,410,942 B1 | 6/2002 | Thibeault et al. | 257/88 |
| 6,420,199 B1 | 7/2002 | Coman et al. | 438/22 |
| 6,420,242 B1 | 7/2002 | Cheung et al. | 438/458 |
| 6,448,102 B1 | 9/2002 | Kneissl et al. | 438/46 |
| 6,455,340 B1 | 9/2002 | Chua et al. | 438/31 |

(Continued)

FOREIGN PATENT DOCUMENTS

EP   0616376 A   9/1994
EP   0795941 A   9/1997

(Continued)

OTHER PUBLICATIONS

Wolf et al: Silicon Processing for the VLSI Era (vol. 1, Chapter 12, pp. 488-490 and 490; 2000).*

(Continued)

*Primary Examiner* — Thao Le
*Assistant Examiner* — Eric Jones
(74) *Attorney, Agent, or Firm* — Koppel, Patrick, Heybl & Philpott

(57) ABSTRACT

The present invention is directed to post-deposition, wet etch processes for patterning AuSn solder material and devices fabricated using such processes. The processes can be applied to uniform AuSn layers to generate submicron patterning of thin AuSn layers having a wide variety of features. The use of multiple etching steps that alternate between different mixes of chemicals enables the etch to proceed effectively, and the same or similar processes can be used to etch under bump metallization. The processes are simple, cost-effective, do not contaminate equipment or tools, and are compatible with standard cleanroom fabrication processes.

21 Claims, 2 Drawing Sheets

(56) References Cited

U.S. PATENT DOCUMENTS

| | | | |
|---|---|---|---|
| 6,465,809 B1 | 10/2002 | Furukawa et al. | 257/94 |
| 6,468,824 B2 | 10/2002 | Chen et al. | 438/46 |
| 6,475,889 B1 | 11/2002 | Ring | 438/571 |
| 6,559,075 B1 | 5/2003 | Kelly et al. | 438/795 |
| 6,562,648 B1 | 5/2003 | Wong et al. | 438/46 |
| 6,599,644 B1 * | 7/2003 | Zekentes et al. | 428/627 |
| 6,607,931 B2 | 8/2003 | Streubel | 438/22 |
| 6,657,236 B1 | 12/2003 | Thibeault et al. | 257/98 |
| 6,677,173 B2 | 1/2004 | Ota | 438/22 |
| 6,716,654 B2 | 4/2004 | Hsu et al. | 438/22 |
| 6,740,604 B2 | 5/2004 | Kelly et al. | 438/795 |
| 6,757,314 B2 | 6/2004 | Kneissl et al. | 372/50 |
| 6,762,119 B2 * | 7/2004 | Ray et al. | 438/614 |
| 6,786,390 B2 | 9/2004 | Yang et al. | 228/179.1 |
| 6,800,500 B2 | 10/2004 | Coman et al. | 438/22 |
| 6,806,112 B1 | 10/2004 | Horng et al. | 438/29 |
| 6,809,341 B2 | 10/2004 | Hsu et al. | 257/79 |
| 6,821,804 B2 | 11/2004 | Thibeault et al. | 257/98 |
| 6,846,686 B2 | 1/2005 | Saeki et al. | 438/22 |
| 6,849,878 B2 | 2/2005 | Bader et al. | 257/103 |
| 7,071,084 B2 * | 7/2006 | Yokoyama et al. | 438/584 |
| 7,341,946 B2 * | 3/2008 | Kailasam et al. | 438/687 |
| 2002/0000559 A1 | 1/2002 | Hoof | |
| 2002/0068396 A1 | 6/2002 | Fitzergald | |
| 2003/0173602 A1 | 9/2003 | Hsu et al. | |
| 2003/0180980 A1 | 9/2003 | Margalith et al. | |
| 2003/0197170 A1 | 10/2003 | Bader et al. | |
| 2004/0072382 A1 | 4/2004 | Kelly et al. | |
| 2004/0248377 A1 | 12/2004 | Yoo et al. | |
| 2006/0014001 A1 * | 1/2006 | Zhang et al. | 428/195.1 |
| 2006/0131616 A1 * | 6/2006 | Devaney et al. | 257/226 |

FOREIGN PATENT DOCUMENTS

| | | |
|---|---|---|
| JP | 61059886 | 3/1986 |
| JP | 11238913 | 8/1999 |
| WO | WO0048278 | 8/2000 |

OTHER PUBLICATIONS

M.K. Kelly et al. "Optical Process for Liftoff of Group III-Nitride Films" Rapid Research Note, Technische Universitat Munche, Garching, Germany, Nov. 28, 1996, pp. 1-2.

E.F. Schubert at al., "Resonant Cavity Light-Emitting Diode", AT&T Bell Laboratories, Murray Hill, New Jersey, (1991) pp. 921-923.

E.F. Schubert, "Light Emitting Diodes", Cambridge University Press, 2003, pp. 198-211.

* cited by examiner

SELECTIVE WET ETCHING OF GOLD-TIN BASED SOLDER

STATEMENT AS TO FEDERALLY SPONSORED RESEARCH

This invention was made with Government support under Grant No. 70NANB4H3037 awarded by the Department of Commerce (DOC). The federal government may have certain rights in the invention.

BACKGROUND OF THE INVENTION

1. Field of the Invention

The present invention relates to semiconductor devices, and more particularly to light emitting devices and methods of fabricating light emitting devices.

2. Description of Related Art

Light emitting diodes and laser diodes are well known solid state electronic devices capable of generating light upon application of a sufficient voltage. Light emitting diodes and laser diodes may be generally referred to as light emitting devices (LEDs). Light emitting devices typically include a p-n junction formed in an epitaxial (epi) layer such as gallium nitride (GaN). The epi layer is usually grown on a substrate such as sapphire ($Al_2O_3$), silicon (Si), silicon carbide (SiC), or gallium arsenide (GaAs). The wavelength distribution of the light generated by the LED depends on the material from which the p-n junction is fabricated and the structure of the thin epitaxial layers that include the active region of the device. Commercial high-efficiency LEDs are typically fabricated from two classes of III-V semiconductor materials. Group-III nitride (III-N) based materials are used for the ultraviolet to blue-green color range, and Group-III arsenide-phosphide (III-AsP) for yellow to near-infrared.

There has been a great deal of recent interest in LEDs formed of Group-III nitride based material systems because of their unique combination of material characteristics, including high breakdown fields, wide bandgaps (3.36 eV for GaN at room temperature), large conduction band offset, and high saturated electron drift velocity. The doped and active layers in such devices are typically formed on a substrate which can be made from a variety of different materials such as silicon (Si), silicon carbide (SiC), and sapphire ($Al_2O_3$). SiC wafers are often preferred for such heterostructures because they have a much closer crystal lattice match to Group-III nitrides, resulting in Group-III nitride films of higher quality. SiC also has a very high thermal conductivity, such that the total output power of Group-III nitride devices on SiC is not limited by the thermal resistance of the wafer, as is the case for many devices formed on sapphire or Si. The availability of semi-insulating SiC wafers also provides the capacity for device isolation and reduced parasitic capacitance, which makes commercial devices possible.

During fabrication of semiconductor devices or circuits such as chips and multichip modules (MCM), a substrate (substrate wafer, growth wafer) provides the base or support for subsequent processing operations in which additional layers, components, or other materials are applied (e.g. epitaxial materials or layers, printed circuit boards, and disk platters). Patterning is a fabrication process in which a specific design can be introduced into a layer or surface during semiconductor fabrication. Patterning can be achieved in a number of ways, such as selectively depositing or selectively removing a material. Wet etching (chemical etching, chemical milling) is a patterning process used in semiconductor fabrication that removes a material by relying on chemical reactions in the liquid phase. The process typically uses acids, bases or other chemicals to dissolve away unwanted materials. Based on the nature, etching is broadly classified into isotropic and anisotropic. Isotropic etching is same in all directions while anisotropic etching is direction sensitive. Material to be etched and type of the etchant determines the nature of the etch i.e. isotropic or anisotropic. For example, silicon is etched anisotropically in potassium hydroxide (KOH) while most of the commonly used metals (e.g. Au, Ag, Ni, Sn) and dielectrics (e.g. $SiO_2$, SiN) in semiconductor technology utilize isotropic etchants. Anisotropic etch provides better control over the patterns or shapes to be produced while isotropic etch is employed in blanket etching or with combination of different materials for selective etching (patterning).

Selective wet etch processes rely on the different etch rates of an etchant for different materials. In a typical selective wet etch process, one material is etched rapidly while another is etched very slowly or not etched at all. An aqueous HF solution, for example, can etch $SiO_2$ very rapidly while not etching silicon. For any particular etchant, the etch rate for the film being etched should be higher than the etching rates for both the mask and/or the substrate. Due to resolution limitations inherent in wet etching processing, the technique is generally used to pattern coarse features such as bond pads or large vias where, for example, an aspect ratio of 1 to 5 can be achieved reliably. However, despite such limitations, wet etch processing has found widespread use because it provides many advantages including low cost, high reliability, high throughput, and excellent selectivity with respect to both mask and substrate materials.

A typical wet etch process involves coating the target or etch layer on the semiconductor wafer with a etch mask. One of the most commonly used etch mask is photoresist. Standard Photolithography is performed in the photoresist to expose the regions of the target layer to be etched. Wafer is immersed in the etchant to etch the target layer. After etching, the mask layer, in this case photoresist is usually then removed, leaving one or more patterned target layers which may require further processing in order to cure, clean, or remove residual solvent. Most materials are patterned in this manner, including silicon dioxide ($SiO_2$), Au and Sn.

Modern device architectures can require patterning of a composite gold-tin (AuSn) solder material during fabrication. Individually, gold (Au) or tin (Sn) metal films can be wet etched quite readily after deposition and commercial etches suitable for such processes are available and well known. The chemistries of the two metals, however, are quite different, such that no single chemical will etch both metals together. Therefore, patterning of composite AuSn solder material during device fabrication is typically achieved during deposition by using a selective area deposition technique, rather than by post-deposition selective etching of a blanket AuSn layer.

Selective deposition techniques typically used to pattern AuSn solder materials can include screen-printing through a patterned foil, electro-plating or vacuum deposition using a patternable sacrificial layer such as photo-resist, and physical cutting of free-standing thick films to create preforms or other materials molded into predetermined shapes, volumes, or dimensions, including without limitation a solder preform. These technologies, however, suffer from certain disadvantages.

Due to incorporation of flux in the solder paste, screen-printing of solder paste is not a clean process. The paste typically undergoes reflow to drive off the flux, which can lead to contamination and leave voids in the material. Minimum thickness and dimension requirements are therefore generally large for layers formed in this manner, typically in the range of 20-50 microns. Preforms can be used for selective solder bumping. However, the technology is thickness and size-limited, and also costly due to the need to physically place preform on a wafer.

In practice, therefore, the use of selective area deposition restricts the range of device architectures that are possible for AuSn solder due to the inherent limitations of available deposition techniques. Additionally, in some cases it is simply not desirable to pattern the AuSn at the time it is deposited. A uniform bond interface is simpler and preferred over a patterned bond, for example, when AuSn is used to wafer-bond two substrates.

SUMMARY OF THE INVENTION

The present invention provides improved methods for fabricating devices, particularly methods for patterning one or more materials in light emitting devices. These methods use one or more standard available chemistries to wet etch AuSn solder material, thereby circumventing the need for, and limitations of, selective AuSn deposition processes.

Briefly, and in general terms, the present invention is directed to post-deposition, wet etch processes for patterning AuSn solder material and to devices fabricated using such processes. The processes can be applied to a uniform (blanket) AuSn layer to generate submicron patterning of thin AuSn layers having a wide variety of features (e.g. shape, size, thickness, and pattern). The process can also be used in many different applications such as to etch metals under a solder layer (bump metallization). Furthermore, the processes are simple, cost-effective, do not contaminate equipment or tools, and are compatible with standard cleanroom fabrication processes.

In particular, the present invention utilizes a combination of wet chemistries to selectively etch an AuSn solder layer deposited on a substrate or other areas or layers of a semiconductor device, either before or after the layer is reflowed at the eutectic point. Multiple etching steps that alternate between different mixes of chemicals enables the etch to proceed effectively, and the same or similar processes can be used to etch under bump metallization (e.g. Ti, Ni, Pt, Au).

In one of several aspects, the invention relates to a method of fabricating a light emitting device (LED) that includes a selective wet etch process in which a layer of AuSn solder is patterned. In another aspect, additional device layers are selectively patterned at the same time as the solder layer. In yet another aspect, the solder medium is provided as a preform. In a further aspect, the solder medium is reflowed.

In another aspect, the invention relates to a method of selectively wet etching an AuSn solder medium including treatment with aqua regia. In yet another aspect, the method includes treatment with aqua regia and other chemical etchants such as HF, HCl and $HNO_3$ and combinations thereof. In a further aspect, aqua regia and other etchant treatments can alternate.

In another aspect, the invention relates to a patterned layer of AuSn solder fabricated by selective wet etching. In another aspect, the invention relates to a device containing such a layer, such as a light emitting device. In a further aspect, the light emitting device is a light emitting diode. In yet a further aspect, the device is a flip chip device.

In another aspect, the invention relates to a method for selective wet etching at least one layer containing AuSn solder material. In yet another aspect, the method includes treatment with chemical etchants such as HF, HCl and $HNO_3$ and combinations thereof that can be used alternatively through the etch process. In a further aspect, the method includes treatments with chemical etchants such as HF, HCl and $HNO_3$ and combinations thereof that alternate with aqua regia treatments. In yet a further aspect, the invention relates to a patterned layer fabricated according to the method. In another aspect, the invention relates to a device containing such a patterned layer.

These and other aspects and advantages of the invention will become apparent from the following detailed description and the accompanying drawings, which illustrate by way of example the features of the invention.

DETAILED DESCRIPTION OF THE INVENTION

Figure 1A:
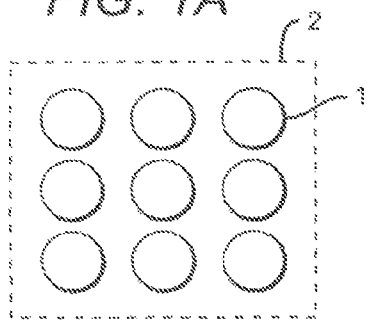
FIG. 1A is a schematic plan view of sub-micron AuSn solder bumps fabricated using methods according to the present invention.

The present invention provides improved methods for fabricating semiconductor devices, particularly methods for patterning one or more materials in light emitting devices. These methods use one or more standard available chemistries particularly adapted to wet etch AuSn solder material, thereby circumventing the need for, and limitations of, selective AuSn deposition processes.

In particular, the present invention utilizes a combination of wet chemistries to selectively etch an AuSn solder layer, either before or after it is reflowed at the eutectic point. Suitable chemistries for use with the invention include without limitation aqua regia, hydrofluoric acid (HF), nitric acid ($HNO_3$), hydrochloric acid (HCl) and combinations thereof. In addition to combining chemicals, the use of multiple etching steps that alternate between different mixes of chemicals enables the etch to proceed effectively. It is understood that the chemistries used and the amount of time that the AuSn solder is exposed to each of the alternating chemistries can vary depending on a number of factors. One of these factors is the composition of the AuSn solder, i.e. the percentage of Au verses the percentage of Sn, and this thickness of the AuSn. Another is the concentrations of the chemistries. Accordingly, it is understood that different embodiments of the method can be realized depending upon these and other factors.

There are several important advantages provided by the present invention, including without limitation those described below:

(a) the process can be applied to a uniform (blanket) AuSn layer, which is much easier to deposit on a wafer than a patterned AuSn layer; especially for films >5 um.
(b) the process is simple, cost-effective, and compatible with standard cleanroom fabrication processes;
(c) solder patterning can be done either before, or after, reflow or bonding of the AuSn layer;
(d) there are no film thickness constraints for the process (i.e. dimensions are limited only by the inherent limitations of current lithography techniques);
(e) allows dense, fine scale (e.g. submicron) patterning of thin AuSn layers;
(f) allows patterning of complex shapes (e.g. rings, polygons) of widely varying sizes on single wafer, limited only by the lithography capabilities of the etch mask layer;
(g) no equipment/tool contamination occurs during the process;
(h) the same or similar chemicals can be used to etch materials to fabricate under bump metallization (e.g. Ti, Ni, Pt, Au); and
(i) feature size (e.g. etch depth and etch profile) is limited only by the inherent limitations of lithography techniques and etch selectivity of the etch mask.

The processes of the present invention can facilitate device fabrication in many applications requiring patterned solder or selective removal of solder, including without limitation flip chip packaging in some types of devices; wet etching of sputter deposited AuSn solder layers in dicing streets on devices, patterning of AuSn solder bond layers in chip scale packaging applications (e.g. in order to provide separate electrical contacts for IC-LED technology), and general electronic and optoelectronic packaging applications using solder bumps (e.g. AuSn ball grid arrays). A flip chip device is a device made using flip chip microelectronic assembly/packaging, including without limitation the direct electrical connection of face-down ("flipped") electronic components onto substrates, circuit boards, carriers or the like by means of conductive bumps on the chip bond pads (e.g. Direct Chip Attach or DCA).

Other features and advantages of the invention will be apparent from the following detailed description when taken together with the drawings, and from the claims. The following description presents preferred embodiments of the invention representing the best mode contemplated for practicing the invention. This description is not to be taken in a limiting sense but is made merely for the purpose of describing the general principles of the invention whose scope is defined by the appended claims.

Before addressing details of embodiments described below, some terms are defined or clarified. As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Furthermore, any definitions used refer to the particular embodiments described herein and are not to be taken as limiting; the invention includes equivalents for other undescribed embodiments. Although methods and materials similar or equivalent to those described herein can be used in the practice or testing of the present invention, suitable methods and materials are described below. In case of conflict, the present specification, including definitions, will control. In addition, the materials, methods, and examples are illustrative only and not intended to be limiting.

Attention is now directed to more specific details of embodiments that illustrate but not limit the invention.

The present invention relates to wet etch processes which can be used to fabricate a patterned AuSn solder layer, layers patterned using such processes, and to devices having such patterned layers. The solder medium can be introduced to a device or substrate, prior to patterning, by deposition or as a preform or electroplating.

In particular, the present invention utilizes a combination of wet chemistries to selectively etch an AuSn solder layer deposited on a device or substrate surface, either before or after the layer is reflowed at the eutectic point. The use of multiple selective wet etching steps that alternate between different mixes of chemicals enables the etch to proceed effectively, and the same or similar processes can be used to etch under bump metallization (e.g. Ti, Ni, Pt, Au, TiW). The processes of the present invention can be useful in fabricating semiconductor chips and devices.

The solder medium can be deposited as a coating or blanket layer using any suitable deposition technique, including without limitation electroplating, vapor deposition, evaporation, sputtering, layering, sprinkling, beading, extruding, printing, patterning, spraying or via the application of a solid or semi-solid material such as a preform. As used herein, the term "layer" or "coating" is intended to mean a thickness, course, or fold laid or lying over or under another layer or support. A layer may be contiguous (e.g. blanket) or non-contiguous (e.g. patterned, beaded or sprinkled). The optimal thickness of the solder layer can vary depending upon the particular application. Preforms may be customized to the required shape and size using commercially available preform formats such as preform ribbon. Preforms may be subjected to a reflow process for surface-bonding prior to patterning.

The present invention can be used to fabricate many different AuSn features in many different semiconductor devices. FIG. 1A-1D show schematic plan views of different exemplary features that can be fabricated utilizing methods according to the present invention. FIG. 1A shows sub-micron AuSn solder bumps (1) on a substrate (2) useful for devices including but not limited to photonic crystals, laser diodes, and acoustic devices. The bumps (1) can be etched from a blanket layer of AuSn deposited on the substrate (2) using the methods described above. Non-limiting examples of a substrate include a small, thin circular slice of a semi-conducting material, such as pure silicon (Si) or silicon carbide (SiC) on which an integrated circuit or flip chip can be formed, and a device wafer. As used herein, a "chip" (die, integrated circuit or IC) is a single piece of semiconductor wafer containing an entire integrated circuit which has not yet been packaged. It is understood, that the substrate (2) can also include different epitaxial and metal layers to form different semiconductor devices, with the bumps capable of being formed on these different layers, or directly on the substrate (2).

Figure 1B:
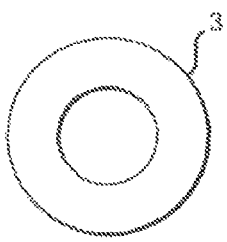
FIG. 1B is a schematic plan view of an AuSn solder ring fabricated using methods according to the present invention.
Figure 1C:
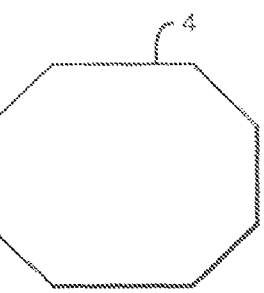
FIG. 1C is a schematic plan view of an octagon-shaped AuSn solder fabricated using methods according to the present invention.
Figure 1D:
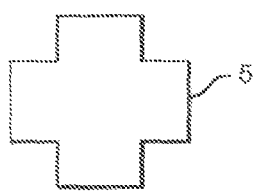
FIG. 1D is a schematic plan view of a cross-shaped AuSn solder preform.

FIG. 1B is a schematic plan view of an AuSn solder ring (3) that can also be formed on the substrate (2) using methods according to the present invention. AuSn solder rings are particularly useful for devices such as a vertical-cavity surface-emitting laser (VCSEL). The present invention can also be used to more elaborate shapes from a blanket AuSn layer. FIG. 1C is a schematic plan an octagon-shaped AuSn feature (4) and FIG. 1D is a schematic plan view of a cross-shaped AuSn solder feature (5).

Materials adjacent to or below the AuSn solder may also be selectively etched using the processes of the present invention, including without limitation Ti, Ni, Pt, Au or combinations thereof. As used herein, the term "adjacent to" when referring to a layer or coating on a particular surface does not necessarily mean that the layer or coating is immediately next to the surface. There may or may not be another contiguous or non-contiguous layer, coating, or material present between the layer or coating described and the surface, and the surface itself can be another layer or coating.

Each etch bath can be either a single chemistry or a combination of two or more chemistries, in concentrated or dilute form, as required. Preferably, at least one chemistry is aqua regia. Aqua regia is generally known in the art and is particularly applicable to dissolving gold and platinum during etching. Other suitable chemistries for use in the present invention include without limitation HF, HCl, HNO$_3$, and combinations thereof. The use of multiple etching steps that alternate between different mixes of such chemicals can enable the etch process to proceed more effectively. The number of steps and the particular chemistries used are dependent upon the target materials and the type of structure required for a particular application (e.g. bond pads).

Photoresist patterns can be defined using standard photolithographic techniques, and any suitable etch-resistant masking material can be used as an etch mask for patterning, including with out limitation metals such as silicon nitride (SiN), photoresist, benzocyclobutene (BCB), polyamides, and semiconductor materials such as GaN.

EXAMPLE 1

The following describes one embodiment of a method according to the present invention used to etch a structure having an AuSn feature or layer. The structure being etched comprises an AuSn layer that can be formed from a preform that was reflowed onto a thermally oxidized Si carrier wafer having a Ti/Pt/Au blanket metallization. The AuSn layer can have many different thickness and the Si wafer can have many different diameters, with a suitable AuSn layer being 0.5 millimeters thick and the wafer having a 2 inch diameter. A resist mask layer is included on the AuSn layer with a suitable layer comprising commercially available photoresist 220-7 and being approximately 6 μm thick. A standard quartz plate lithography mask layer (i.e. 220-7 photoresist) followed by a 3 minute post-bake at 110° C.

Two solutions were then used in an alternating fashion for wet etching, as indicated below:
1. HF/HCl (1:1)—1 min.
2. Aqua-regia—1 min.
3. HF/HCl (1:1)—0.5 min.
4. Aqua-regia—2 min.
5. HF/HCl (1:1)—0.5 min.
6. Aqua-regia—1.5-2 min.

The mask layer can then be removed using known mask layer removal processes.

Figure 2A:
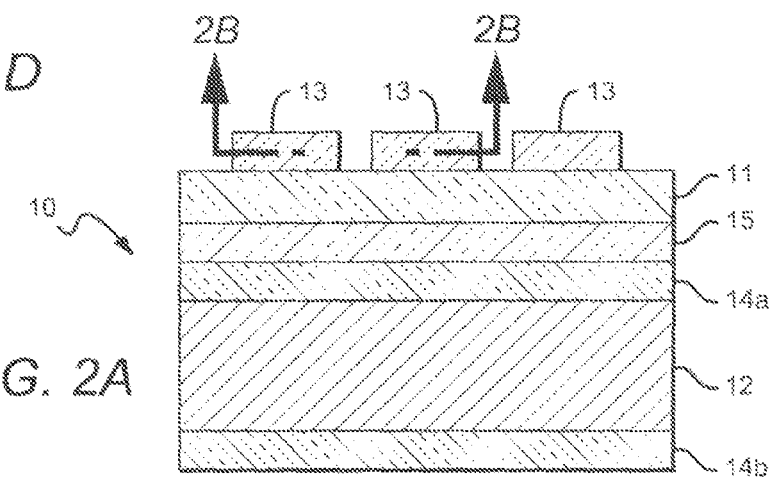
FIG. 2A is a schematic cross sectional view of one embodiment of the invention showing an LED device wafer having a preform containing AuSn solder medium and an adjacent layer of patterned photoresist.
Figure 2B:
FIG. 2B is a plan view optical microscopy image of the embodiment shown in FIG. 2A showing alternating surfaces containing patterned photoresist and exposed AuSn.
Figure 2C:
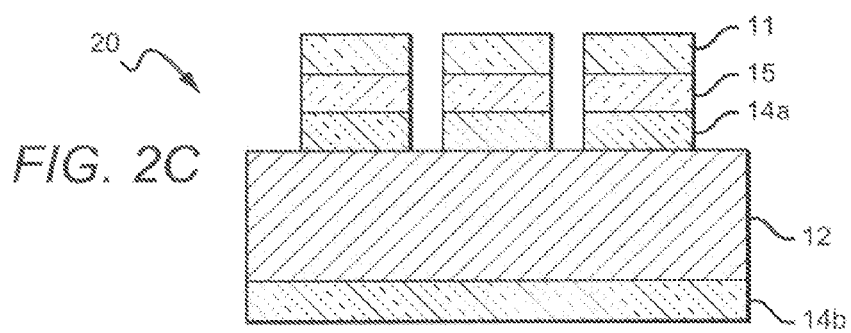
FIG. 2C is a schematic cross sectional view of the embodiment shown in FIG. 2A after a selective wet etch process according to the invention.

FIGS. 2A-2C show a structure that can be etched using the embodiment described in Example 1. For simplicity and ease of interpretation, only a small number of representative patterned features are shown. FIG. 2A is a schematic cross sectional view of one embodiment of the invention showing an LED device wafer (10) having a preform containing AuSn solder medium (11) and an adjacent layer of patterned mask layer (13) that preferably comprises a photoresist. The device wafer (10) also comprises a silicon (Si) substrate (12), two SiO$_2$ insulating layers (14a and 14b), and a Ti/Pt/Au metal stack layer (15). The total thickness of the preform, before and after reflow, was about 12μ (0.5 mil) and about 5-10μ (50-100 kÅ), respectively. As used herein, the term "wafer" is intended to mean a thin slice of semiconductor material used in manufacturing semiconductor devices and integrated circuits. As used herein, the term "device wafer" is intended to mean a wafer populated with multiple chips. A Si wafer supporting multiple LEDs, prior to singulation (i.e. LED wafer), is a non-limiting example of a device wafer.

FIG. 2B is a plan view optical microscopy image of the embodiment shown in FIG. 2A showing a portion of the patterned top surface on a device wafer (10). The alternating sections containing patterned photoresist (13) coated on AuSn and exposed AuSn (11) surfaces are clearly delineated.

FIG. 2C is a schematic cross sectional view of the embodiment shown in FIG. 2A after the selective wet etch process and subsequent removal of the patterned photoresist (13). There was no electrical continuity between the pads, indicating that the AuSn solder layer (11), as well as the Ti/Pt/Au stack layer (15) and uppermost SiO$_2$ (14a) layer, were selectively etched. The AuSn solder layer (11) was preferably etched using the HF/HCl (1:1) and aqua-regia is alternating times as described above. These and other materials alone or in combination can be used to etch the Ti/Pt/Au stack layer (15) and uppermost SiO$_2$ (14a) layer.

EXAMPLE 2

Many different etching chemistries can be used according to the present invention and can be applied for different amounts of time. As another example, a metallized Si carrier wafer with a sputter AuSn layer that was not reflowed, was etched. Two different approaches were used for wet etching experiments:
1. HF/HCl (1:1)—1 min
2. Aqua-regia—1 min
OR
Aqua-regia—4 min.

Both methods successfully etched the AuSn layer. The total etch time was reduced in comparison to Experiment 1, possibly due to the thinner AuSn layer used for this embodiment. The metal stack also appeared to be completely etched. The etch time is also further reduced when using HF/HCL and aqua regia in combination compared to an etch using aqua-regia alone.

Figure 3A:
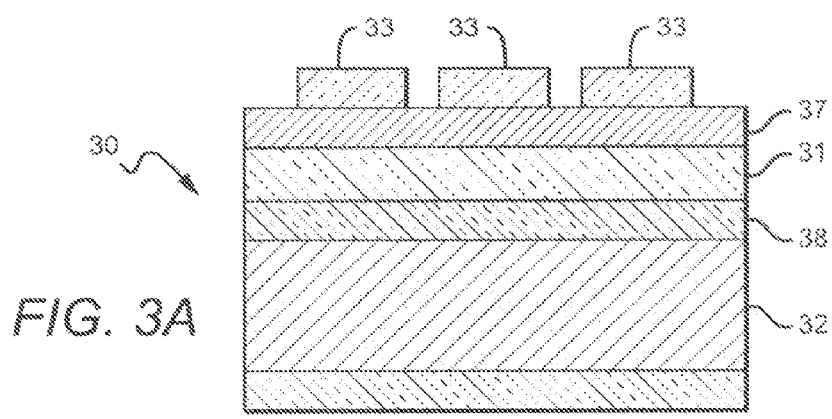
FIG. 3A is a schematic cross sectional view of one embodiment of the invention showing an LED device wafer having a layer containing AuSn solder medium sandwiched between a metal stack and a layer of photoresist.
Figure 3B:
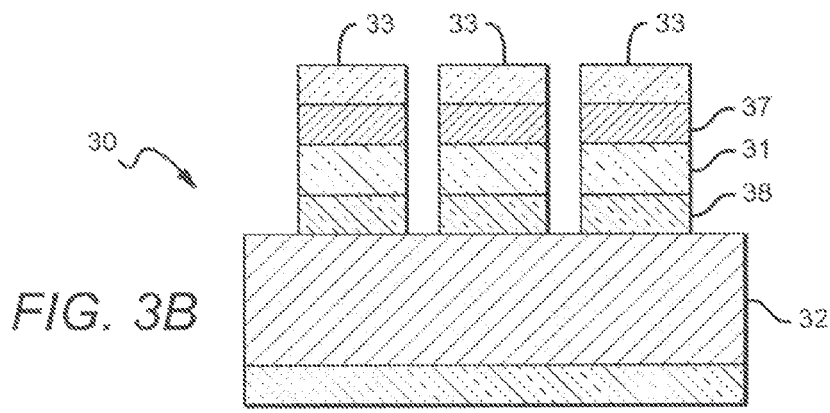
FIG. 3B is a schematic cross sectional view of the embodiment shown in FIG. 3A after a selective wet etch process according to the invention.

FIG. 3A is a schematic cross sectional view of one embodiment structure that can be etched using the method this method. An LED device wafer (30) is included containing a substrate 32 having a layer of AuSn solder medium (31) sandwiched between a metal stack (38) and a gold flash (37) overlaid with a layer of patterned photoresist (33). FIG. 3B is a schematic cross sectional view of the embodiment shown in FIG. 3A after a selective wet etch process according to the invention, showing selective and complete etching through the gold flash (37), AuSn solder layer (31), and metal stack (38). As used herein, the term "gold flash" is intended to mean an extremely thin layer of gold, with a thickness measured on the molecular level, which is either electroplated or chemically plated onto a surface.

As discussed above additional chemistries can also be employed such as $HF/HNO_3$. For example, one embodiment of a method according to the present invention using $HF/HNO_3$ (1:1) in combination with other chemistries to etch AuSn is as follows:
1. $HF/HNO_3$ (1:1)
2. Aqua-Regia
3. $HF/HNO_3$ (1:1)
4. Aqua-Regia
5. HF/HCl (1:1)
6. Aqua-Regia The time used for each of these chemistries varies depending on the type of adjacent layers and the thickness/composition of the AuSn layer.

The embodiments and examples set forth herein were presented to explain the nature of the present invention and its practical application, and thereby to enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. For example, while the use of GaN LED chips is described herein, the invention contemplated is not so limited. One skilled in the art will recognize that the invention may potentially be applied to a variety of bond medium materials in many different types of devices or applications, and that various fabrication technologies may be used.

I claim:

1. A method for fabricating an electronic device using selective wet etching, the method comprising:
    providing at least one wafer comprising at least one first surface;
    depositing at least one first layer comprising solder material adjacent to the at least one first surface, wherein the solder material comprises composite AuSn;
    depositing at least one second layer comprising etch mask material on said at least one first layer comprising solder material;
    introducing a plurality of liquid etching compositions to the at least one first layer comprising solder material, each of said plurality of liquid etching compositions comprising a different chemical composition, said plurality of liquid etching compositions introduced in a repeating, alternating fashion; and
    etching the at least one layer comprising solder material for a period of time sufficient to selectively etch at least one portion of the at least one solder layer with the plurality of liquid etching compositions;
    wherein selective wet etching is achieved using a wet etch process comprising:
        introducing the at least one first layer to at least one composition comprising at least one of HF, HCl and $HNO_3$; and
        introducing the at least one first layer to at least one composition comprising aqua-regia.

2. The method of claim 1, further comprising:
    depositing at least one additional layer of material adjacent to the least one first surface; and
    etching the at least one additional layer for a period of time sufficient to selectively etch at least one portion of the at least one additional layer.

3. The method of claim 2, wherein the at least one additional layer comprises at least one of Ti, Pt, Au, Si, Ti, Ni, and Pt.

4. The method of claim 2, wherein the at least one additional layer comprises $SiO_2$.

5. The method of claim 1, wherein the at least one first layer comprises an AuSn preform.

6. The method of claim 5, further comprising reflow soldering the preform.

7. The method of claim 1, wherein the at least one second layer comprises at least one of photo resist and GaN.

8. The method of claim 1, wherein the plurality of liquid etching compositions comprises at least two of HF, HCl, $HNO_3$ and aqua-regia.

9. The method of claim 1, wherein introduction of the at least one composition comprising at least one of HF, HC, and $HNO_3$ alternates with the introduction of the at least one composition comprising aqua-regia.

10. A patterned layer fabricated according to the method of claim 1.

11. A device comprising the layer of claim 10.

12. A device fabricated by the method of claim 1.

13. The device of claim 12, wherein the device is at least one of a flip chip device and a light emitting device.

14. The device of claim 13, wherein the device is a light emitting diode.

15. A method for selective wet etching at least one blanket layer comprising AuSn solder material, the method comprising:
    repeatedly introducing the at least one blanket layer comprising AuSn solder material to a first etch composition comprising aqua-regia, wherein an etch mask layer is on said at least one blanket layer; and
    repeatedly introducing the at least one layer comprising AuSn solder material to a second composition comprising at least one of HF, HCl and $HNO_3$ when said at least one layer is not being introduced to said first etch composition;
    wherein introduction of the second composition comprising at least one of HF, HC, and $HNO_3$ alternates with the introduction of the first composition comprising aqua-regia.

16. A patterned layer fabricated according to the method of claim 15.

17. A device comprising the layer of claim 16.

18. A method for selectively wet etching a AuSn composite layer of solder material using repeated, alternating etchants, the method comprising:
    forming a mask layer on the solder layer, said mask layer comprising openings to said solder layer;
    a first etching of said solder layer through said mask layer openings using a first etch comprising a first chemical composition;
    a second etching of said solder layer through said mask opening using a second etch comprising a second chemical composition, said first and second etchings occurring at different times;
    wherein said first chemical composition comprises at least one of HF, HCl, and $HNO_3$ or aqua-regia; and
    wherein said second chemical composition comprises at least one of HF, HCl, and $HNO_3$ or aqua-regia.

19. The method of claim 18, etching said solder layer faster than an etching method using only one of said first and second compositions.

20. The method of claim 18, wherein said first chemical composition comprises aqua regia.

21. The method of claim 18, wherein said second chemical composition comprises HF, HCl or $HNO_3$.

* * * * *